(12) United States Patent
Ma et al.

(10) Patent No.: US 10,950,712 B2
(45) Date of Patent: Mar. 16, 2021

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chu-Ming Ma, Kaohsiung (TW); Hung-Chi Huang, Tainan (TW); Hsien-Ta Chung, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/425,960

(22) Filed: May 30, 2019

(65) Prior Publication Data
US 2020/0350419 A1 Nov. 5, 2020

(30) Foreign Application Priority Data

Apr. 30, 2019 (CN) .................... 201910359449.X

(51) Int. Cl.
| | |
|---|---|
| *H01L 29/66* | (2006.01) |
| *H01L 29/78* | (2006.01) |
| *H01L 29/49* | (2006.01) |
| *H01L 29/10* | (2006.01) |
| *H01L 21/266* | (2006.01) |
| *H01L 21/02* | (2006.01) |
| *H01L 21/28* | (2006.01) |
| *H01L 21/265* | (2006.01) |

(52) U.S. Cl.
CPC .. *H01L 29/66689* (2013.01); *H01L 21/02244* (2013.01); *H01L 21/266* (2013.01); *H01L 21/26513* (2013.01); *H01L 21/2815* (2013.01); *H01L 29/1095* (2013.01); *H01L 29/4983* (2013.01); *H01L 29/7816* (2013.01)

(58) Field of Classification Search
CPC .......... H01L 29/66689; H01L 29/7816; H01L 29/4983; H01L 21/266; H01L 21/02244; H01L 21/2815; H01L 21/26513; H01L 29/1095; H01L 21/28176; H01L 29/512
See application file for complete search history.

(56) References Cited

U.S. PATENT DOCUMENTS

| | | | |
|---|---|---|---|
| 6,252,278 B1 | 6/2001 | Hsing | |
| 7,361,580 B2* | 4/2008 | Yuhn | H01L 29/4925 257/E21.177 |
| 8,803,234 B1 | 8/2014 | Liao | |
| 2002/0195660 A1* | 12/2002 | Lee | H01L 21/823481 257/344 |
| 2009/0108347 A1* | 4/2009 | Adkisson | H01L 29/42368 257/339 |

* cited by examiner

*Primary Examiner* — Su C Kim
(74) *Attorney, Agent, or Firm* — Winston Hsu

(57) ABSTRACT

A semiconductor device comprises a substrate, a gate structure disposed on the substrate and a gate dielectric layer disposed between the substrate and the gate structure. The gate structure has a first sidewall and a second sidewall opposite to the first sidewall. A first insulating layer disposed on the gate dielectric layer and on the first sidewall of the gate structure. The first insulating layer has a first bird's beak portion covering a rounded bottom corner of the gate structure. A pair of spacers are disposed on the first insulating layer and on the second sidewall, respectively.

17 Claims, 5 Drawing Sheets

SEMICONDUCTOR DEVICE AND METHOD FOR FABRICATING THE SAME

BACKGROUND OF THE INVENTION

1. Field of the Invention

The present invention generally relates to a semiconductor device and method for forming the same. More particularly, the present invention relates to a semiconductor device having asymmetric gate structure and method for forming the same.

2. Description of the Prior Art

Power devices are semiconductor devices used in high voltage application. Double-diffused metal-oxide-semiconductor (DMOS) devices have drawn much attention recently. Conventional DMOS devices are categorized into vertical double-diffused MOS (VDMOS) devices and lateral double-diffused MOS (LDMOS) devices. Having advantages of higher operational bandwidth, higher operational efficiency, and convenience to be integrated with other semiconductor devices in integrated circuits due to the planar structures, LDMOS devices are prevalently used in high operation voltage environment such as CPU power supply, power management system, AC/DC converter, and high-power or high frequency (HF) band power amplifier.

A key parameter for power device is the breakdown voltage, which usually refers to the highest voltage the device may sustain during operation. To achieve the breakdown voltage requirement, the drift region in a conventional LDMOS usually requires a certain area of the substrate and has cause hindrance for device minimization. Therefore, there is still a need in the field to provide a semiconductor device which may facilitate device minimization and also provide better voltage endurance.

SUMMARY OF THE INVENTION

One objective of the present invention is to provide a semiconductor device having higher break-down voltage by performing a selective oxidation process to form an insulating layer on a sidewall of the gate structure adjacent to the drain region and rounding a bottom corner of the gate structure.

To achieve the objective described above, the present invention provides a semiconductor device including a substrate, a gate structure disposed on the substrate and comprising a first sidewall and a second sidewall opposite to the first sidewall, a gate dielectric layer disposed between the gate structure and the substrate, a first insulating layer disposed on the gate dielectric layer and covering the first sidewall of the gate structure, and a pair of spacers respectively disposed on the first insulating layer and on the second sidewall of the gate structure. The first insulating layer comprises a first bird's beak portion covering a rounded bottom corner of the gate structure.

To achieve the objective described above, the present invention provides a method for forming a semiconductor device including providing a substrate, forming a gate structure on the substrate, wherein the gate structure comprises a first sidewall and a second sidewall opposite to the first sidewall, forming a mask layer completely covering the substrate and the gate structure, patterning the mask layer to form an opening in the mask layer to expose the first sidewall of the gate structure, performing an oxidation process to form a first insulating layer on the first sidewall, removing the mask layer, and forming a pair of spacer respectively on the first insulating layer and on the second sidewall.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

Please refer to FIG. 1 to FIG. 6, which are cross-sectional diagrams illustrating the steps for forming a semiconductor device according to a first embodiment of the present invention. The cross-sectional structures of the semiconductor device shown in FIG. 1 to FIG. 6 are along the XY-plane defined by the X direction and the Y direction. X direction and Y direction are perpendicular.

Figure 1:
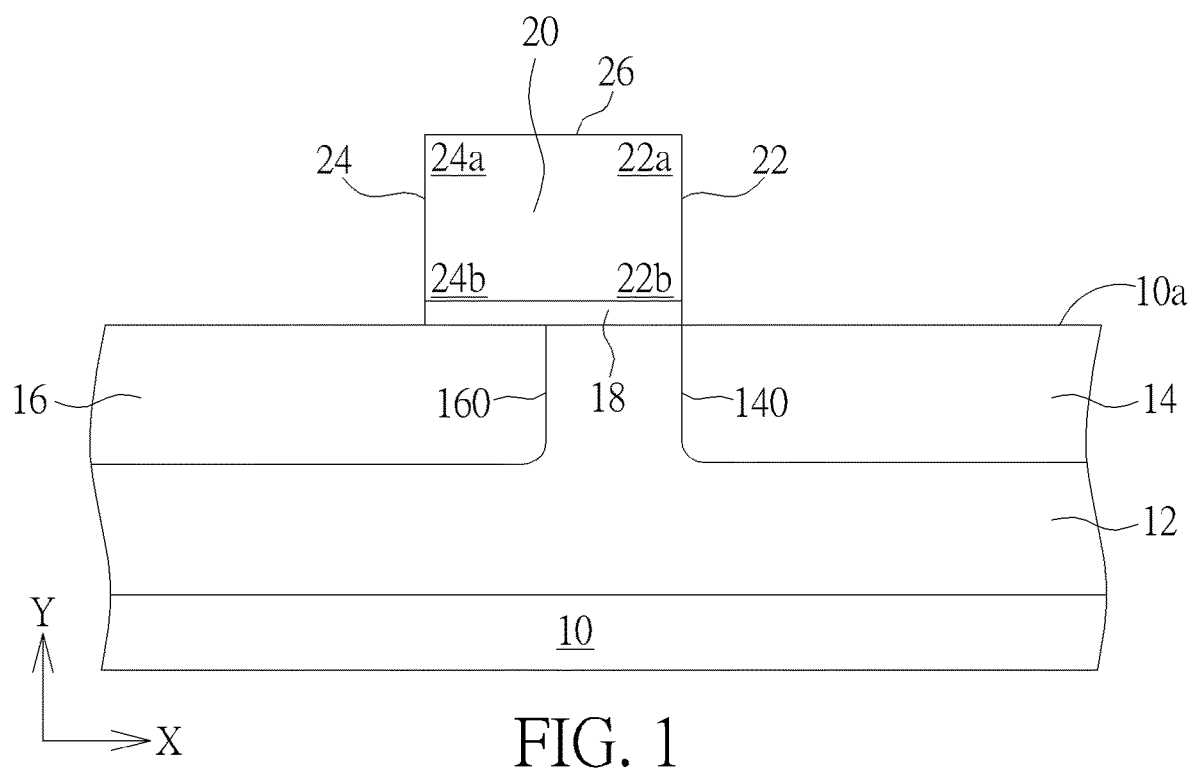
FIG. 1 to FIG. 6 are schematic cross-sectional diagrams illustrating a method for forming a semiconductor device according to a first embodiment of the present invention

As shown in FIG. 1, a substrate 10 is provided. The substrate 10 may be a semiconductor substrate, such as a silicon substrate, an epitaxial substrate, a silicon-germanium substrate, a silicon carbide substrate or silicon-on-insulator (SOI) substrate, but not limited thereto. The substrate 10 may have a main surface 10a which is perpendicular to the Y direction. A well region 12 is formed in the substrate 10 under the main surface 10a. In some embodiments, the well region 12 may be a doped region formed by performing an ion implantation process to implant conductive dopants into the substrate 10. In other embodiment, the well region 12 may be a doped epitaxial layer of the substrate 10. The well region 12 may have a first conductivity type, and the substrate 10 may have a second conductivity type complementary to the first conductivity type. For example, first conductivity type is N-type and the second conductivity is P-type. It should be understood that, in other embodiments, the first conductivity type may be P-type and the second conductivity may be N-type.

Please still refer to FIG. 1. A gate structure 20 is formed on the main surface 10a of the substrate 10. A gate dielectric layer 18 is disposed between the gate structure 20 and the substrate 10. Along the X direction, the opposite two sides of the gate structure 20 may respectively have a first sidewall 22 and a second sidewall 24. The first sidewall 22 is between the first top corner 22a and the first bottom corner 22b of the gate structure 20. The second sidewall 24 is between the second top corner 24a and the second bottom corner 24b of the gate structure 20. The gate structure 20 may have a top surface 26 between the first top corner 22a and the second top corner 24a and between the first sidewall 22 and the second sidewall 24. According to some embodiments, the gate structure 20 may comprise conductive material, such as poly silicon, but not limited thereto. The gate dielectric layer 18 may comprise insulating material, such as silicon oxide, silicon nitride, high-k dielectric material, but not limited thereto. The method for forming the gate structure 20 and the dielectric layer 18 may comprise depositing a gate dielectric material layer (such as silicon oxide, for example) on the substrate 10 and then depositing a gate material layer (such as poly silicon, for example) on the gate dielectric layer. After that, a patterning process such as a photolithography-etching process may be performed to remove the unnecessary portions of the gate material layer and the gate dielectric material layer, thereby patterning the gate material layer and the gate dielectric material layer into the gate structure 20 and the gate dielectric layer 18.

Please still refer to FIG. 1. A drift region 14 and a body region 16 may be formed in the well region 12 in the substrate 10 at two sides of the gate structure 20 and respectively adjacent to the first sidewall 22 and the second sidewall 24 of the gate structure 20. The drift region 14 and the body region 16 are spaced apart from each other by the well region 12 and are not in direct contact with each other. The drift region 14 may have the same conductivity type as the well region 12, such as N-type. The body region 16 may have the opposite conductivity type to the drift region, such as P-type. The boundary 140 between the drift region 14 and the well region 12 may near the first sidewall 22 of the gate structure 20. For example, as shown in FIG. 1, the first sidewall 22 may be aligned with the boundary 140 along the Y direction. In other examples, the first sidewall 22 may shift a distance from the boundary 140 along the X direction and therefore may be vertically disposed on the drift region 14 or the well region 12 near the boundary 140. The gate structure 20 may stride over the boundary 160 between the body region 16 and the well region 12. The gate structure 20 may vertically overlap a portion of the body region 16.

Figure 2:
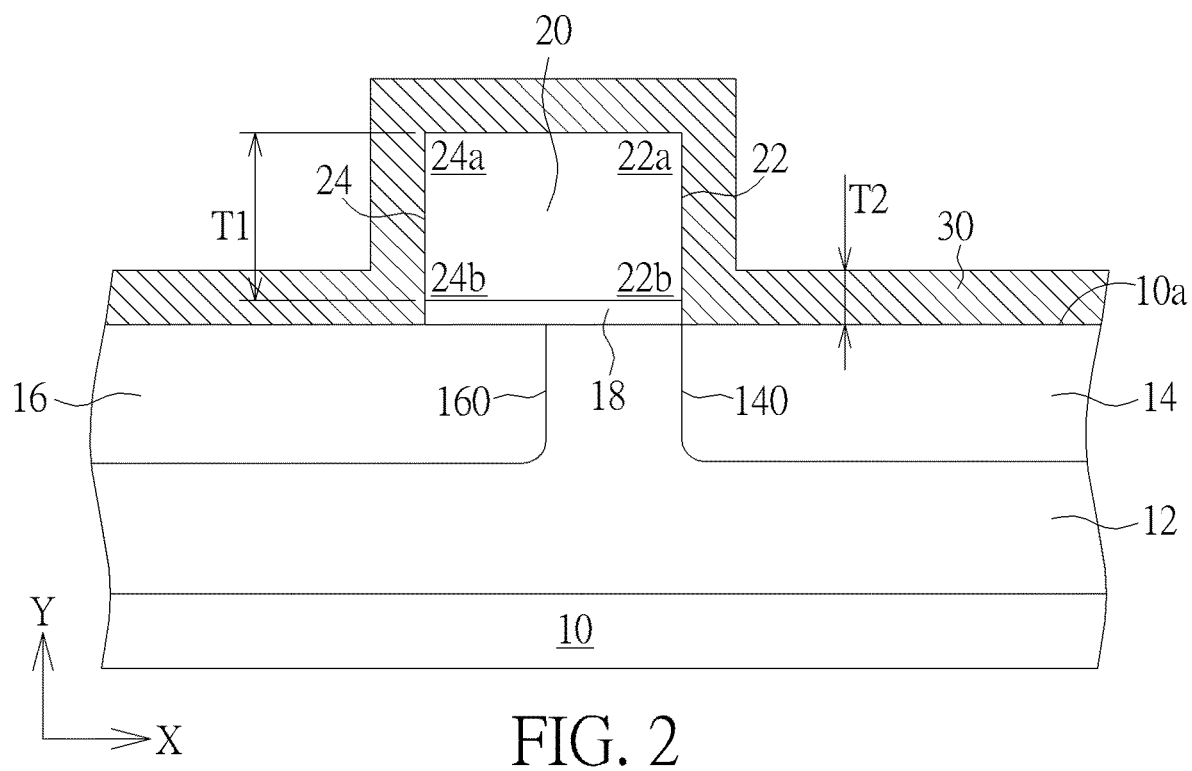

Please refer to FIG. 2. Subsequently, a mask layer 30 may be formed on the substrate 10 in a blanket manner. The mask layer 30 may conformally cover along the main surface 10a of the substrate 10 and the first sidewall 22, the second sidewall 24 and the top surface 26 of the gate structure 20. In some embodiments, the mask layer 30 may be a silicon nitride layer. The mask layer 30 may be formed by plasma enhanced chemical vapor deposition (PECVD) process or sub-atmospheric chemical vapor deposition (SACVD) process. According to an embodiment, the thickness T2 of the mask layer 30 may be approximately 25% of the thickness T1 of the gate structure 20. For example, when the thickness T1 of the gate structure 20 is approximately 800 angstroms (Å), the thickness T2 of the mask layer 30 may be approximately 200 Å. The thickness T2 of the mask layer 30 should be well controlled because that over-thick mask layer 30 may cause problems to a subsequent patterning of the mask layer 30. On the contrary, the mask layer 30 having insufficiently thickness may not be able to protect the underlying regions from being oxidized during a subsequent oxidation process P1 as shown in FIG. 4.

Figure 3:
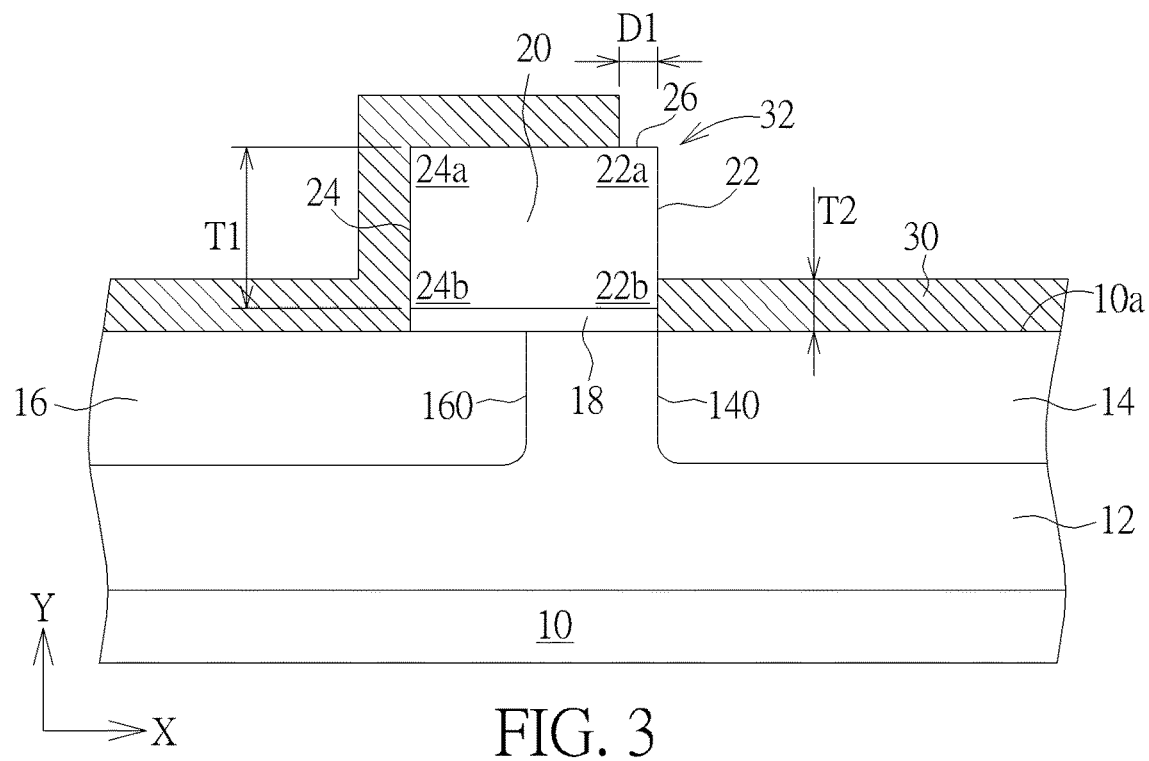

Please refer to FIG. 3. Afterward, a patterning process such as a photolithography-etching process may be performed to remove a portion of the mask layer 30, thereby forming the patterned mask layer 30 having an opening 32 to expose the first sidewall 22, the first top corner 22a and a portion of the top surface 26 of the gate structure 20. The other regions of the gate structure 20 and the substrate 10 are still covered by the patterned mask layer 30 and are not exposed.

Figure 4:
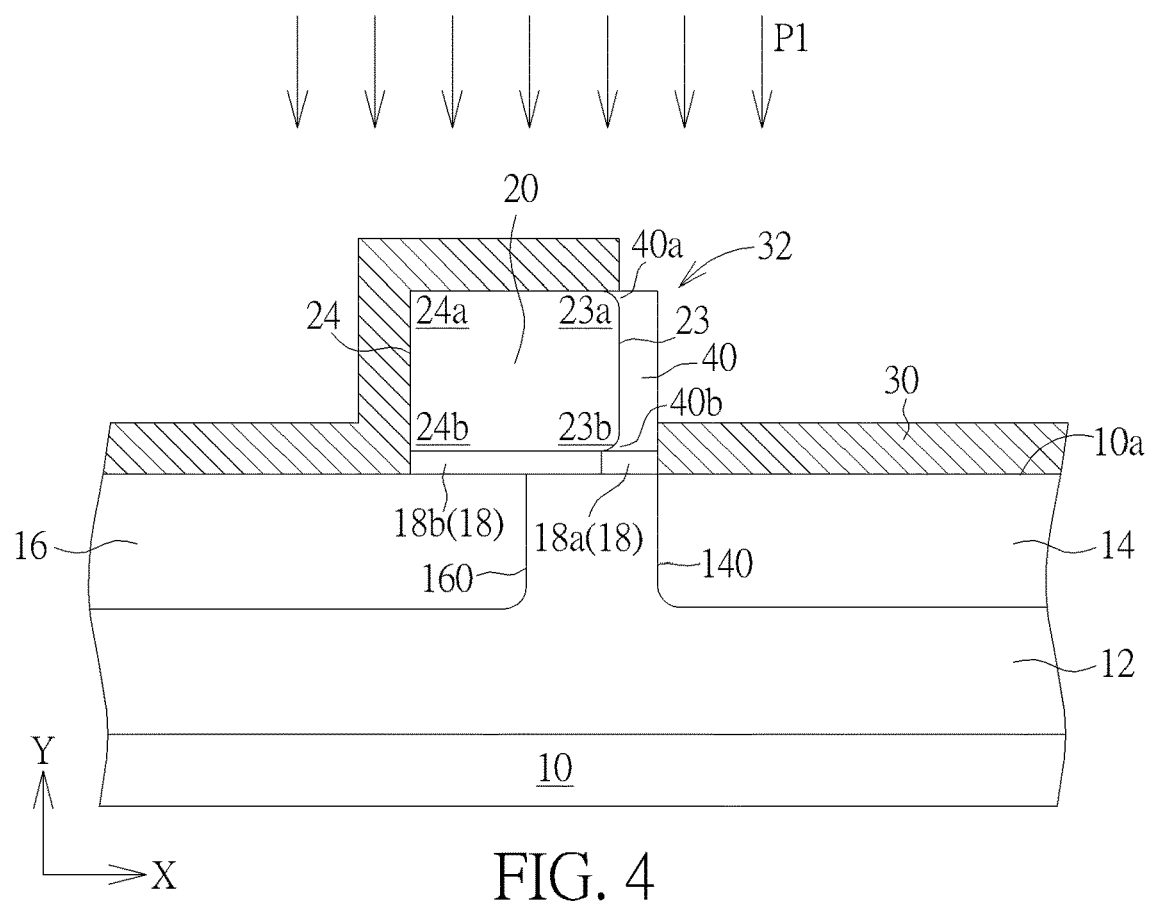

Please refer to FIG. 4. Following, an oxidation process P1 is performed to oxidize the exposed first top corner 22a and first sidewall 22 of the gate structure 20 through the opening 32, thereby forming a first insulating layer 40 on the gate dielectric layer 18 and covering the first sidewall 23 of the remaining gate structure 20. In other words, a portion of the gate structure 20 is oxidized into the first insulating layer during the oxidation process P1. In some embodiments, the oxidation process P1 may be a dry oxidation process using oxygen gas and nitrogen gas. In other embodiments, the oxidation process P1 may be a wet oxidation process such as ISSG using oxygen gas, hydrogen gas and nitrogen gas. In some embodiments, the gate structure 20 may comprise poly silicon, and the first insulating layer 40 may comprise silicon oxide. In some embodiments, the gases such as oxygen used during the oxidation process P1 may diffuse faster along the interface between the gate structure 20 and the gate dielectric layer 18. Accordingly, the gate structure 20 near the gate dielectric layer 18 may have a higher oxidation rate and the first insulating layer 40 may have a first bird's beak portion 40b near the gate dielectric layer 18 and covering a rounded bottom corner 23b of the remaining gate structure 20. Similarly, in some embodiments, the gases such as oxygen used during the oxidation process P1 may also diffuse faster along the interface of the top surface 26 of the gate structure 20 and the patterned mask layer 30, and therefore a second bird's beak portion 40a may be formed near the top surface 26 and covering a rounded top corner 23a of the remaining gate structure 20. In some embodiments, the gases such as oxygen, hydrogen or nitrogen used in the oxidation process P1 may diffuse into the first portion 18a of the gate dielectric layer 18 under the first insulating layer 40. Accordingly, the composition of the first portion 18a of the gate dielectric layer 18 under the first insulating layer 40 and the composition of the second portion 18b of the gate dielectric layer 18 under the remaining gate structure 20 may be different. For example, the first portion 18a may have oxygen, hydrogen or nitrogen in a concentration higher than that of the second portion 18b of the gate dielectric layer 18. As shown in FIG. 4, a boundary between the first portion 18a and the second portion 18b of the gate dielectric layer 18 may be vertically aligned with the first bird's beak portion 40b of the first insulating layer 40 in the Y direction. The thickness (such as the thickness measures along the X direction) of the first insulating layer 40 may be controlled by controlling the width of the opening 32 and the processing time of the oxidation process P1.

Figure 5:
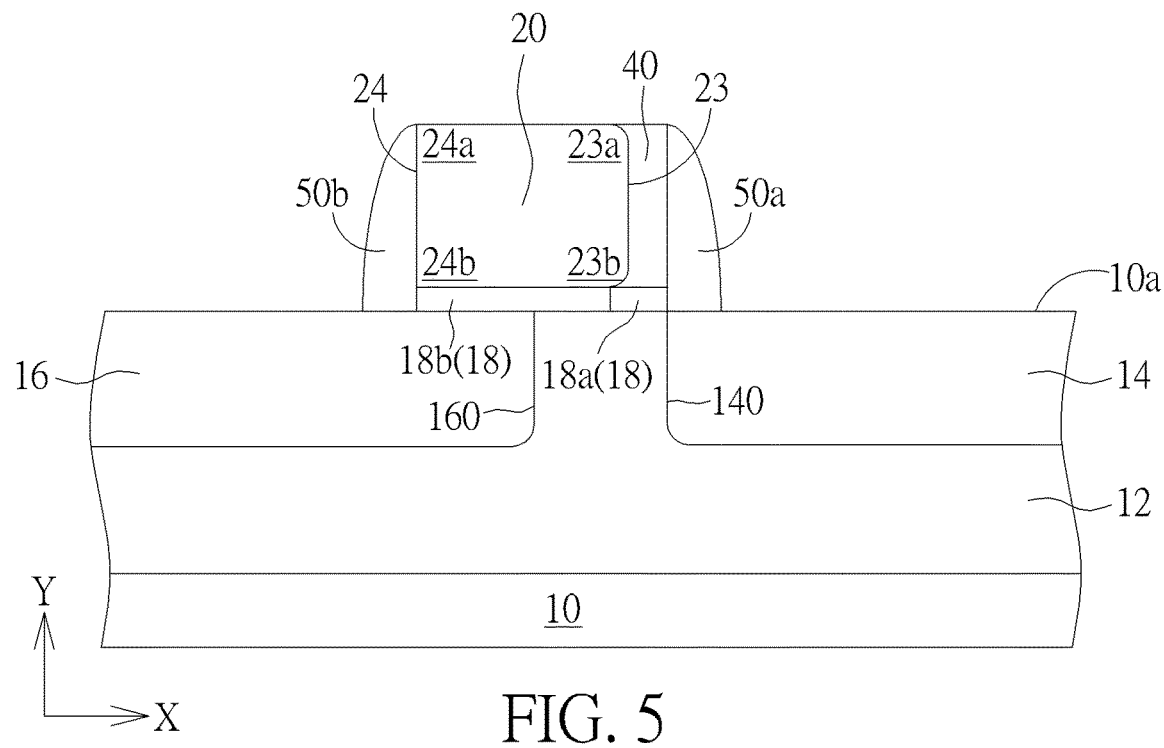

Please refer to FIG. 5. After the oxidation process P1, the mask layer 30 is removed. The top surface 26 and the second sidewall 24 of the remaining gate structure 20 and the top surface 10a of the substrate are exposed. A pair of spacers 50a and 50b are then formed respectively on the first insulating layer 40 and the second sidewall 24 of that remaining gate structure 20. The spacers 50a and 50b may be formed by self-aligned process. For example, after removing the mask layer 30, a spacer material layer (not shown) may be formed on the substrate 10, and an anisotropic etching process (such as dry etching process) may be performed to remove unnecessary portion of the spacer material layer not on the two sides of the gate structure 20. The remaining spacer material layer on the two sides of the gate structure 20 becomes the spacers 50a and 50b. The second sidewall 24 is in direct contact with the spacer 50b, the first sidewall 23 is spaced apart from the spacer 50a by the first insulating layer 40. The spacers 50a and 50b may have a single-layered structure or a multi-layered structure. The person skilled in the art should understand that the single-layered or multi-layered spacers 50a and 50b bay be formed by depositing a single layered or multi-layered spacer material layer and performing one or more anisotropic etching processes. In some embodiments, after removing the mask layer 30 and before forming the spacers 50a and 50b, one or more implantation processes may be performed, using the gate structure 20 and the first insulating layer 40 as the implanting mask to implant dopants into the substrate 10 to form lightly doped regions (not shown) at two sides of the gate structure 20.

Figure 6:
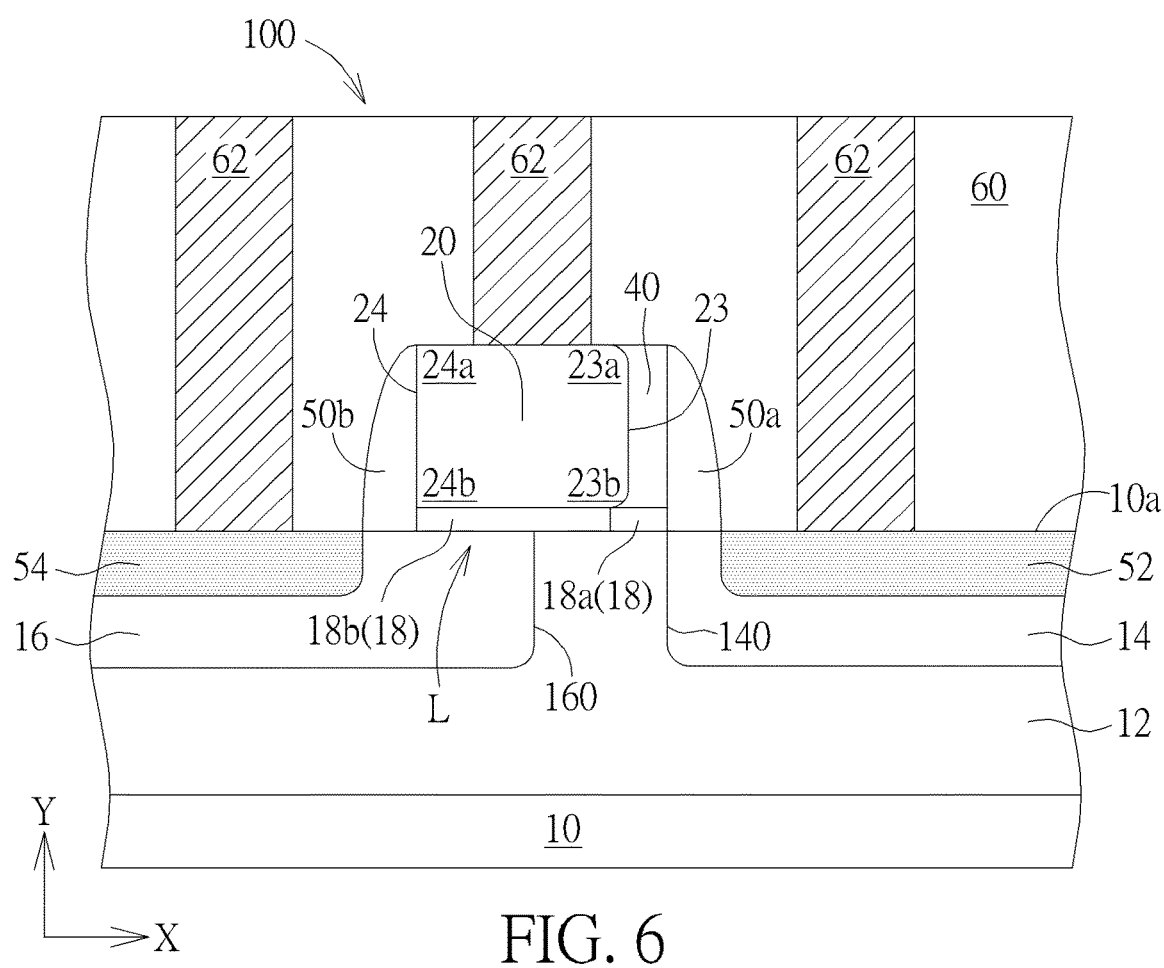

Please refer to FIG. 6. Subsequently, a source/drain implantation process may be performed, using the gate structure 20, the first insulating layer 40 and the spacers 50a and 50b as the implanting mask to implant dopants into the substrate 10 at two sides of the gate structure 20, thereby forming a drain region 52 and a source region 54 self-aligned to the outer edges of the spacers 50a and 50b. An interlayer dielectric layer 60 is then formed on the substrate 10 in a blanket manner and covers the gate structure 20 and the substrate 10. A plurality of contact plugs 62 are then formed in the interlayer dielectric layer 60 and respectively electrically connect to the gate structure 20, the drain region 52 and the source region 54, and the semiconductor device 100 according to the first embodiment of the present invention is therefore obtained. In the illustrated embodiment, both of the drain region 52 and the source region 54 have the first conductivity type, such as N-type. The drain region 52 is completely within the drift region 14 and spaced apart from the rounded bottom corner 23b of the gate structure 20 by the spacer 50a, the first portion 18a of the gate dielectric layer 18 and the first insulating layer 40. The source region 54 is completely within the body region 16 and spaced apart from the second bottom corner 24b by the spacer 50b and the second portion 18b of the gate dielectric layer 18. The semiconductor device 100 has a channel region L in the body region 16 directly under the gate structure 20 and near the main surface 10a of the substrate 10. The channel region L is between the source region 54 and the boundary 160. The length of the channel region L may be influenced by the overlapping width of the gate structure 20 and the body region 16 and the source region 52 (or the lightly doped region, not shown) to the second sidewall 24 of the gate structure 20. The drift region 14 and the well region 12 under the gate structure 20 may reduce the high voltage applied to the drain region 52 to a lower voltage level applied to the channel region L and the breakdown between the drain region 52 and the source region 54 may be eliminated.

As shown in FIG. 6, by using the mask layer 30 and performing the oxidation process P1 to selectively oxidize the portion of the gate structure 20 near the drain region 52, the first insulating layer 40 is formed intervening between the remaining gate structure 20 and the drain region 52. The conductive portion (such as poly silicon) of the gate structure 20 may be farther distanced from the drain region 52. In this way, the electrically isolation between the gate structure 20 and the drain region 52 may be improved without causing unexpected influences to the source region 54, the length of the channel region L and other semiconductor devices integrally formed with the semiconductor device 100 on the substrate 10. Furthermore, the remaining gate structure 20 between the spacers 50a and 50b may have an asymmetric cross-section, as shown in FIG. 6. The top corner 23a and bottom corner 23b adjacent to the drain region 52 may have a more rounded profile with respect to the first top corner 24a and the second bottom corner 24b adjacent to the source region 52. More important, the bottom corner 23b of the gate structure 20 adjacent to the drain region 52 is beneficial for reducing the strength of the electrical field. Additionally, the oxidation process P1 may be able to repair the defects in the first portion 18a of the gate dielectric layer 18 formed in previous process steps such as the etching process to pattern the gate dielectric layer 18. The quality of the first portion 18a of the gate dielectric layer 18 is therefore improved.

Other embodiments or variations directed to the semiconductor devices and the manufacturing methods will be described in the following paragraphs. To simplify the disclosure, the following description will be focus on and be directed to the different features between the embodiments rather than redundantly repeating similar components. In addition, like reference numerals will refer to like elements throughout the disclosure to facilitate the comparison between embodiments.

Figure 7:
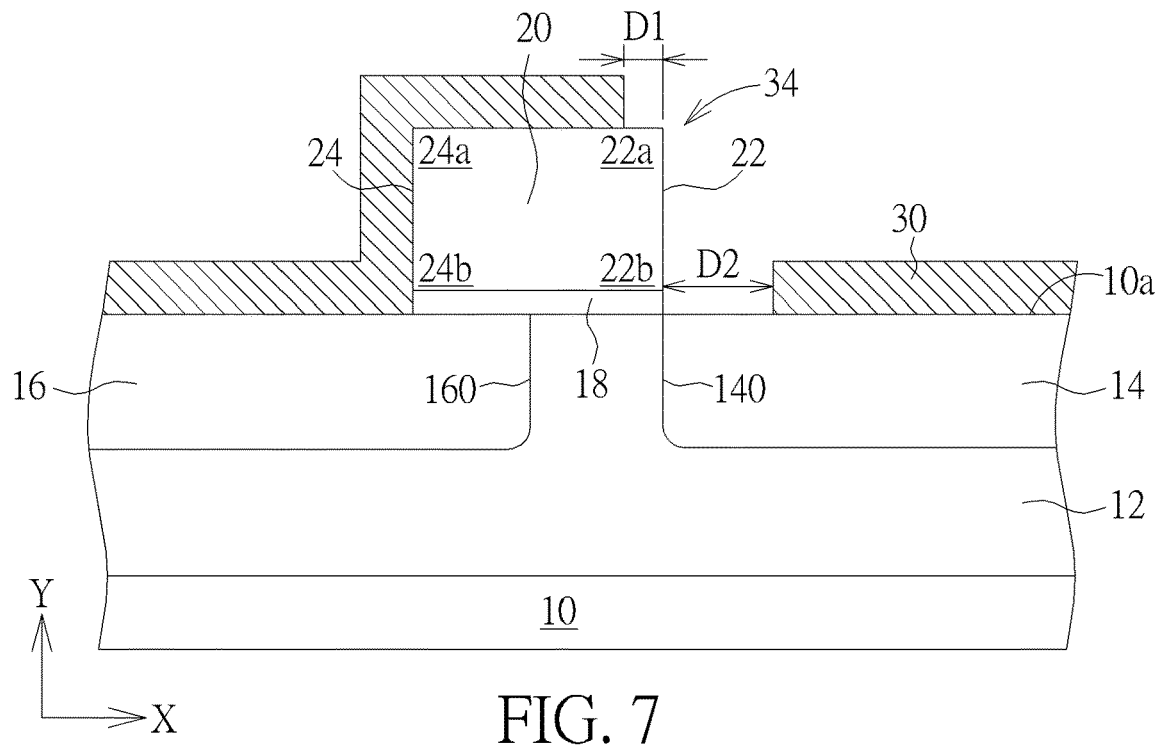
FIG. 7 to FIG. 10 are schematic cross-sectional diagrams illustrating a method for forming a semiconductor device according to a second embodiment of the present invention.

Please refer to FIG. 7 to FIG. 10, which are cross-sectional diagrams illustrating the steps for forming a semiconductor device according to a second embodiment of the present invention. The difference between the first embodiment and the second embodiment is that, as shown in FIG. 7, the opening 34 of the patterned mask layer 30 exposes the first sidewall 22, the first top corner 22a and a portion of the top surface 26 of the gate structure 20 and a portion of the main surface 10a adjacent to the first sidewall 22 of the gate structure 20. Similarly, the other regions of the gate structure 20 and the substrate 10 may be covered by the patterned mask layer 30.

Figure 8:
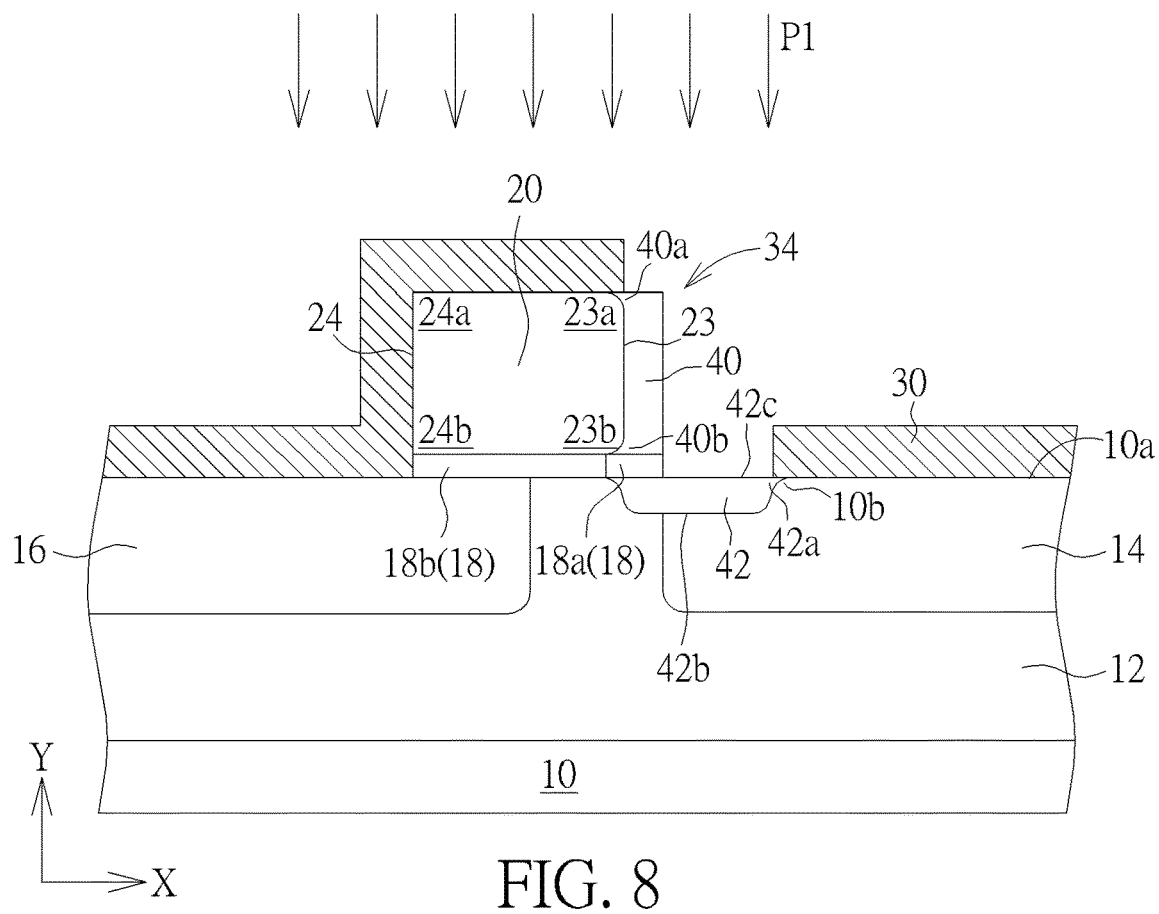

Subsequently, as shown in FIG. 8, an oxidation process P1 is performed to oxidize the exposed regions of the gate structure 20 and the substrate 10 from the opening 34, thereby forming a first insulating layer 40 on the first sidewall 23 of the remaining gate structure 20 and a second insulating layer 42 in the substrate 10 adjacent to the first sidewall 23. In some embodiments, the substrate 10 may comprise silicon and the second insulating layer 42 may comprise silicon oxide. A bottom surface 42b of the second insulating layer 42 is lower than the main surface 10a of the substrate 10. In some embodiments, the first insulating layer 40 and the second insulating layer 42 may have a same thickness. In some embodiments, the second insulating layer 42 may have a third bird's beak portion 42a adjacent to the main surface 10a of the substrate 10. The third bird's beak portion 42a may extending along the main surface 10a of the substrate 10 and covering a rounded top corner 10b of the substrate 10. As previously illustrated, the gases used in the oxidation process P1 may diffuse into a first portion 18a of the gate dielectric layer 18 directly under the first insulating layer 40. Accordingly, the first portion 18a of the gate dielectric layer 18 under the first insulating layer 40 and the second portion 18b of the gate dielectric layer 18 under the remaining gate structure 20 may have different compositions. In some embodiments, the first portion 18a may have a higher oxygen concentration than the second portion 18b. As shown in FIG. 8, the first insulating layer 40, the first portion 18a of the gate dielectric layer 18 and the second insulating layer 42 collectively form an L-shaped insulating layer. Similarly, the thickness of the first insulating layer 40 and the thickness of the second insulating layer 42 may be controlled by the width of the opening 32 and the processing time of the oxidation process P1.

Figure 9:
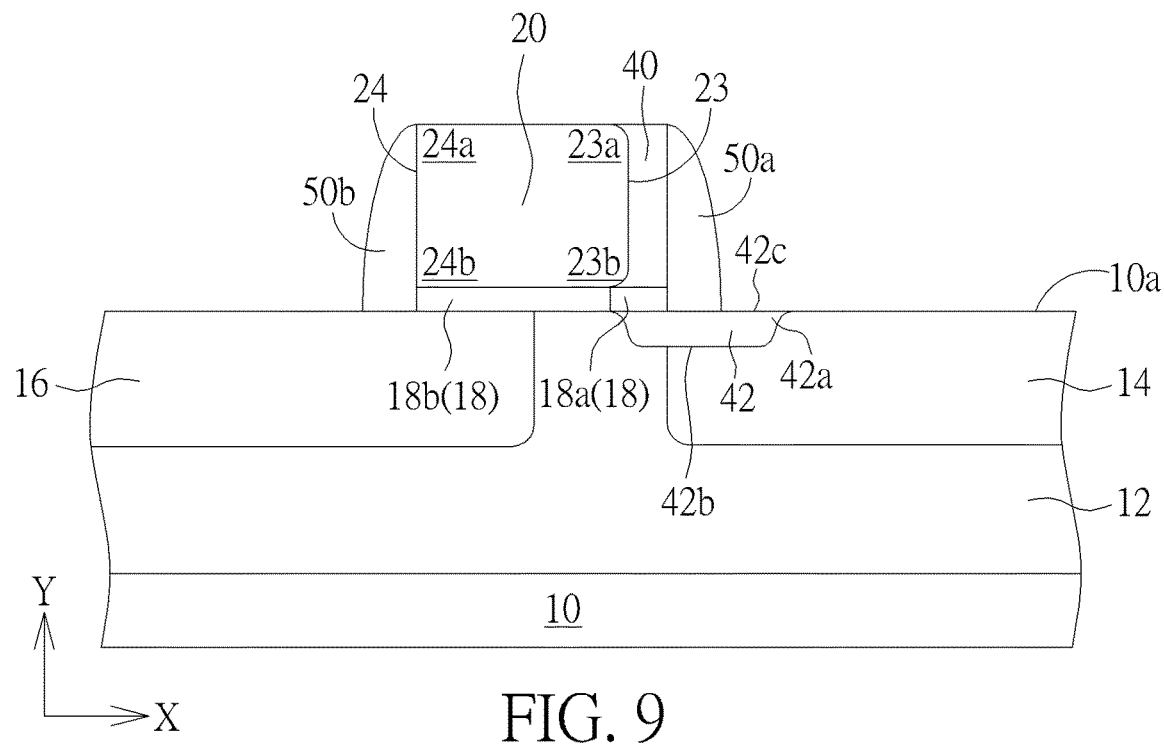

Subsequently, as shown in FIG. 9, the mask layer 30 is removed and the top surface 26 and second sidewall 24 of the gate structure 20 and the main surface 10a of the substrate 10 are exposed. A pair of spacers 50a and 50b are then formed respectively on the L-shaped insulating layer and the second sidewall 24 at two sides of the gate structure 20. In some embodiments, by controlling the width of the opening 34 shown in FIG. 8, the second insulating layer 42 may have a length (laterally extending along the X direction) larger than the width of the spacer 50a. In this case, the bottom of the spacer 50a may be completely overlapped by the second insulating layer 42 and a portion of the top surface 42c of the second insulating layer 42 may be exposed from the spacer 50a.

Figure 10:
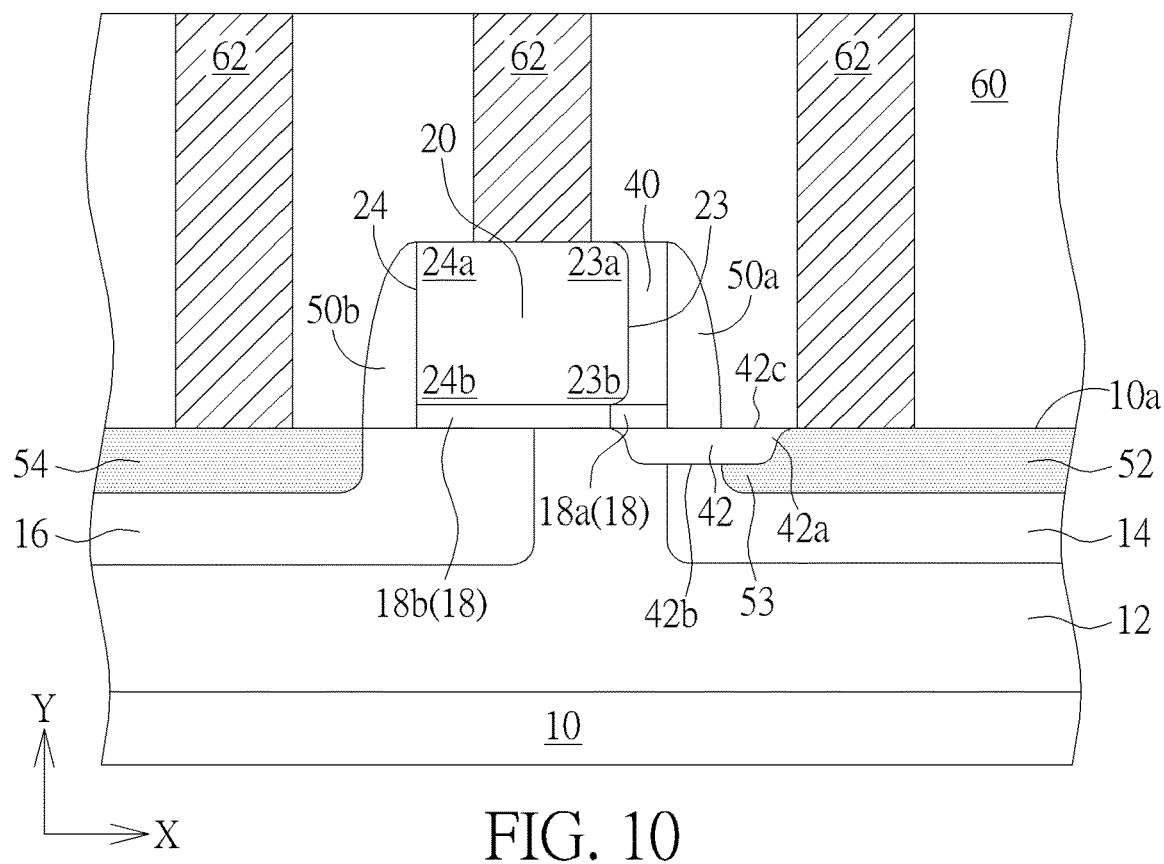

Subsequently, as shown in FIG. 10, an source/drain implantation process may be performed, using the gate structure 20, the first insulating layer 40 and the spacers 50a and 50b as the implanting mask to implant dopants into the substrate 10 at two sides of the gate structure 20, thereby forming a drain region 52 and a source region 54 near the outer edges of the spacers 50a and 50b. An interlayer dielectric layer 60 is then deposited on the substrate 10 in a blanket manner and covers the gate structure 20 and the substrate 10. A plurality of contact plugs 62 are then formed in the interlayer dielectric layer 60 and respectively electrically connect to the gate structure 20, the drain region 52 and the source region 54, and the semiconductor device 100 according to the second embodiment of the present invention is therefore obtained. It is noteworthy that, in the second embodiment, the second insulating layer 42 formed in the substrate 10 may prevent some of the dopants in the source/drain implantation process from being implanted into the substrate 10. Accordingly, the portion 53 of the drain region 52 under the second insulating layer 42 may have dopants in a lower concentration. In this way, the strength of the electric field in the portion 53 of the drain region 52 may be reduced.

In one embodiment of the present invention, the first sidewall of the gate structure adjacent to the drain region is selectively oxidized to form a first insulating layer. The conductive portion of the remaining gate structure may be farther distanced from the drain region and the bottom corner of the remaining gate structure may be rounded. Accordingly, the breakdown voltage between the gate structure and the drain region may be improved. In another embodiment of the present invention, a portion of the substrate adjacent to the first sidewall is also oxidized to form a second insulating layer. The second insulating layer may reduce the amount of the dopants being implanted into the substrate during the source/drain implantation process. Accordingly, a portion of the drain region underneath the second insulating layer may have dopants in a lower concentration and the breakdown voltage between the gate structure and the drain region may be further improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
   a substrate;
   a gate structure disposed on the substrate and comprising a first sidewall and a second sidewall opposite to the first sidewall;
   a gate dielectric layer disposed between the gate structure and the substrate;
   a first insulating layer disposed on the gate dielectric layer and covering the first sidewall, wherein the first insulating layer comprises a first bird's beak portion covering a rounded bottom corner of the gate structure;
   a pair of spacers respectively disposed on the first insulating layer and on the second sidewall, wherein the second sidewall is in direct contact with one of the spacer, and the first sidewall is spaced apart from the other one of the spacer by the first insulating layer;
   a second insulating layer formed in the substrate and under the spacer on the first insulating layer; and
   a drain region formed in the substrate and adjacent to the spacer on the first insulating layer, wherein a portion of the drain region is under the second insulating layer.

2. The semiconductor device according to claim 1, wherein the first insulating layer further comprises a second bird's beak portion disposed on a rounded top corner of the gate structure.

3. The semiconductor device according to claim 1, wherein the gate dielectric layer comprises a first portion vertically under the first insulating layer and a second portion vertically under the gate structure, wherein a boundary between the first portion and the second portion is vertically aligned with the first bird's beak portion.

4. The semiconductor device according to claim 3, wherein the first portion and the second portion of the gate dielectric layer comprise different compositions.

5. The semiconductor device according to claim 1, wherein a bottom surface of the second insulating layer is lower than a top surface of the substrate.

6. The semiconductor device according to claim 5, wherein the second insulating layer comprises a third bird's beak portion adjacent to the top surface of the substrate.

7. The semiconductor device according to claim 5, wherein a top surface of the second insulating layer is exposed from a bottom of the spacer.

8. The semiconductor device according to claim 1, further comprising:
   a well region comprising a first conductivity type formed in the substrate;
   a drift region comprising the first conductivity type formed in the well region and adjacent to the first sidewall of the gate structure, wherein the drain region is formed in the drift region;
   a body region comprising a second conductivity type formed in the well region and adjacent to the second sidewall of the gate structure, wherein the gate structure stride over a boundary between the body region and the well region, wherein the first conductivity type and the second conductivity type are complementary; and
   a source region formed in the body region and adjacent to the spacer on the second sidewall.

9. A method for forming a semiconductor device, comprising:
   providing a substrate;
   forming a gate structure on the substrate, wherein the gate structure comprises a first sidewall and a second sidewall opposite to the first sidewall;
   forming a mask layer completely covering the substrate and the gate structure;
   patterning the mask layer to form an opening in the mask layer to expose the first sidewall of the gate structure and a portion of the substrate adjacent to the first sidewall;
   performing an oxidation process to form a first insulating layer on the first sidewall and a second insulating layer in the exposed portion of the substrate;

removing the mask layer;
forming a pair of spacer respectively on the first insulating layer and on the second sidewall; and
forming a drain region in the substrate and adjacent to the spacer on the first insulating layer, wherein a portion of the drain region is under the second insulating layer.

10. The method according to claim 9, wherein the oxidation process comprises oxidizing the first sidewall of the gate structure through the opening to form the first insulating layer.

11. The method according to claim 9, wherein the gate structure comprises poly silicon and the first insulating layer comprises silicon oxide.

12. The method according to claim 9, wherein the mask layer comprise silicon nitride.

13. The method according to claim 9, wherein the oxidation process comprises:
  oxidizing the first sidewall of the gate structure through the opening to form the first insulating layer; and
  oxidizing the exposed portion of the substrate through the opening to form the second insulating layer in the substrate.

14. The method according to claim 9, wherein the second insulating layer comprises a bottom surface lower than a top surface of the substrate.

15. The method according to claim 9, wherein a top surface of the second insulating layer is exposed form a bottom of the spacer on the first insulating layer.

16. The method according to claim 9, wherein the step for forming the gate structure comprises:
  forming a well region comprising a first conductivity type in the substrate;
  forming a drift region and a body region in the well region and spaced apart from each other by the well region, wherein the drift region comprises the first conductivity type, the body region comprises a second conductivity type complementary to the first conductivity type; and
  forming the gate structure on the substrate and disposed on a boundary between the body region and the well region.

17. The method according to claim 16, further comprising the following step after forming the pair of spacers:
  performing an implantation process, using the spacers as a mask to form the drain region and a source region in the substrate and self-aligned to the spacers, wherein the drain region is formed in the drift region and the source region is formed in the body region, wherein the drain region and the source region comprise the first conductivity type.

* * * * *